(12) United States Patent
Tanaka et al.

(10) Patent No.: US 6,575,354 B2
(45) Date of Patent: Jun. 10, 2003

(54) METHOD FOR PRODUCING TIN-SILVER ALLOY PLATING FILM, THE TIN-SILVER ALLOY PLATING FILM AND LEAD FRAME FOR ELECTRONIC PARTS HAVING THE FILM

(75) Inventors: Hisahiro Tanaka, Fukuoka (JP); Matsuo Masuda, Oita (JP); Tsuyoshi Tokiwa, Maastricht (NL)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/986,478

(22) Filed: Nov. 8, 2001

(65) Prior Publication Data

US 2002/0088845 A1 Jul. 11, 2002

(30) Foreign Application Priority Data

Nov. 20, 2000 (JP) ........................................ 2000-352224

(51) Int. Cl.[7] .............................. B23K 31/02; B23K 1/20
(52) U.S. Cl. ......................... 228/254; 228/202; 228/206
(58) Field of Search ................................ 228/202, 206, 228/254

(56) References Cited

U.S. PATENT DOCUMENTS

| | | | | |
|---|---|---|---|---|
| 4,014,715 A | * | 3/1977 | Preston ........................... 134/3 |
| 5,902,472 A | * | 5/1999 | Arai et al. .................. 106/1.25 |
| 6,087,714 A | * | 7/2000 | Kubara et al. ............... 257/666 |
| 6,099,713 A | * | 8/2000 | Yanada et al. ............. 106/1.23 |
| 6,207,035 B1 | * | 3/2001 | Adler et al. ................. 205/154 |
| 6,395,583 B1 | * | 5/2002 | Kubara et al. ............... 257/666 |
| 2001/0004048 A1 | * | 6/2001 | Adler et al. | |
| 2002/0053721 A1 | * | 5/2002 | Kubara et al. | |

FOREIGN PATENT DOCUMENTS

| JP | 62-219950 | | 9/1987 |
|---|---|---|---|
| JP | 4112566390 A | * | 9/1999 |
| JP | 11-279792 | | 10/1999 |
| JP | 2000-164782 | | 6/2000 |
| JP | 2000-265294 | | 9/2000 |
| JP | 2001105178 | | 4/2001 |

OTHER PUBLICATIONS

Japanese Office Action dated Aug. 8, 2002 with English translation.
U.S. patent application Ser. No. 09/953,915 filed Sep. 18, 2001.

* cited by examiner

*Primary Examiner*—Tom Dunn
*Assistant Examiner*—Kiley Stoner
(74) *Attorney, Agent, or Firm*—Stevens, Davis, Miller & Mosher, LLP

(57) ABSTRACT

The present invention relates to a method for producing a tin-silver alloy plating film having an excellent wettability and improved in solderability and said method comprises a step of heat treating the surface of the tin-silver alloy plating film preferably the heat treating temperature is 70–210° C.

19 Claims, 2 Drawing Sheets

METHOD FOR PRODUCING TIN-SILVER ALLOY PLATING FILM, THE TIN-SILVER ALLOY PLATING FILM AND LEAD FRAME FOR ELECTRONIC PARTS HAVING THE FILM

BACKGROUND OF THE INVENTION

1. Field of the Invention

The present invention relates to a soldering technique in electric and electronic parts or circuits using no lead which is one of environmental injurious materials. Particularly, it relates to a method for producing a tin-silver alloy plating film required to have solderability, the tin-silver alloy plating film, and a lead frame for electronic parts which is provided with the plating film.

2. Description of the Prior Art

Recently, environmental problems have been regarded as important, and, as to the parts used for IC packages, it has been attempted to use materials containing no injurious materials for environments.

Of materials used for lead frames for electronic parts, one of the materials especially harmful for environments is lead used in solders. When allowed to stand, lead dissolves out of the solder and exerts a harmful influence upon the human body and living organisms. For this reason, development of solders or solder pastes using no lead has been tried in the electronic industries.

One example of conventional lead frames for electronic parts will be shown below. FIG. 3 is a plan view of a general lead frames for electronic parts, and FIG. 4 is a sectional view of the lead frame for electronic parts shown in FIG. 3 on which is mounted a semiconductor device. In FIG. 3 and FIG. 4, 1a indicates a general lead frame for electronic parts, 2 indicates an outer lead portion, 3 indicates an inner lead portion, 4 indicates a pad, 5 indicates a tie bar portion, 9 indicates a semiconductor chip as a semiconductor device, 10 indicates an adhesive, 11 indicates an electrode pad, 12 indicates a wire, and 13 indicates a molding resin.

The lead frame for electronic parts which has the above construction will be explained.

In FIG. 3, around the pad 4 on which the semiconductor chip 9 is mounted, a plurality of inner lead portions 3 are disposed apart from the pad 4, and the inner lead portions 3 are connected to the outer lead portions 2 through the tie bar portions 5. The lead frame 1a for electronic parts which has the shape as shown in FIG. 3 is obtained by subjecting a plate-like material comprising a Cu alloy, an Fe—Ni alloy or the like to pressing or etching treatment. Moreover, the pad 4 and the inner lead portion 3 are subjected to partial plating of about 3–5 μm with a noble metal such as Ag for inhibiting the oxidation.

Generally, the semiconductor chip 9 is mounted on the lead frame 1a for electronic parts in the following manner. That is, as shown in FIG. 4, the semiconductor chip 9 is die bonded on the pad 4 using the adhesive 10. The electrode pad 11 previously formed on the semiconductor chip 9 is wire bonded to the inner lead portion 3 with wire 12 such as of Au, Al or Cu to perform electrical connection. Thereafter, sealing of them including the wire bonded part is carried out with molding resin 13 such as an epoxy resin. Then, the outer lead portion 2 is subjected to plating with a solder such as a tin alloy to impart solderability. After the tie bar portion 5 is cut, flash removal is carried out and then the outer lead portion 2 is bent to accomplish the formation of a resin sealed semiconductor device. The resulting resin sealed semiconductor device is mounted on an outer equipment substrate such as printed circuit board, and a desired electronic equipment is formed by soldering the outer lead portion 2 and the necessary wiring on the substrate.

As substitutes for lead-containing solders, lead frames for electronic parts the whole surface of which is plated with palladium have been put to practical use. However, use of palladium as a single substance causes deterioration in wettability with the solder when heat is applied at the time of die bonding or wire bonding, and thus there is a problem in reliability of soldering conducted for mounting. Therefore, there is proposed a lead frame for electronic parts which is thinly plated with gold as a protective film on the surface of palladium. However, when the outermost surface is subjected to flash plating with gold, the adhesion between the molding resin and the lead frame for electronic parts is deteriorated, and, therefore, it is necessary to use molding resins which are improved in adhesion to gold, but high in cost. Furthermore, countries supplying palladium are limited and short supply thereof causes increase of cost and the cost further increases due to the use of gold as a protective film.

Furthermore, in the case of the lead frames for electronic parts the whole surface of which is plated with palladium, flashes are apt to be formed at the step of sealing the semiconductor device with a molding resin in fabrication of the semiconductor device, and a step of removal of the flashes is necessary, which causes increase of cost. Moreover, in the case of the lead frames for electronic parts the whole surface of which is plated with palladium, a great difference in potential is produced between palladium and a metal which is a substrate of lead frame. Therefore, nickel or palladium-nickel alloy must be allowed to be present between the palladium and the substrate. In this case, if nickel or a nickel alloy or iron or an iron alloy is used as the substrate, corrosion occurs, and, hence, copper or a copper alloy must be used as the substrate at the present.

As a solder or solder paste using a material other than palladium and using no lead, it has been proposed to form a plating film using a solder or solder paste using no lead with addition of a metal such as indium, bismuth or zinc in place of lead used in tin-lead based solders.

In addition, as solders or solder pastes for reflow soldering, there are proposed ternary or quaternary alloys containing two or more metals in addition to tin. However, as solders for plating, it is difficult to control the precipitation composition of the ternary or quaternary alloy in plating solution at the time of electroplating, and binary alloys comprising tin and another metal are mostly used, but alloys comprising tin and indium are difficult to put to practical use because indium is high in cost. Alloys comprising tin and bismuth have low melting points, but are hard and brittle and, hence, inferior in workability. Therefore, they can hardly be used for lead frames which are subjected to bending. Moreover, they are inferior in solder wettability and low in bonding strength and thermal fatigue strength, and bismuth is apt to precipitate at the interface to cause the lift-off phenomenon that IC lifts from the solder at the time of surface mounting. Those which comprise tin and zinc have melting point close to that of tin-lead based solder, and cost of zinc is low, but since zinc is readily oxidized in the air, when the alloys are subjected to thermal hysteresis in the step of fabrication of semiconductor devices, resulting in deterioration of solder wettability.

Therefore, recently, alloys comprising tin to which silver is added are proposed for solders or solder pastes or solder plating film using no lead.

SUMMARY OF THE INVENTION

The object of the present invention is to provide a method for producing a tin-silver alloy plating film which does not contain lead which is one of environmental harmful materials and which is superior in solder wettability and can improve solderability, a tin-silver alloy plating film produced by the method, and a lead frame for electronic parts having the film.

In order to attain the object of the present invention, according to the method for producing a tin-silver alloy plating film of the present invention, a tin-silver alloy plating film is formed on a plate-like material such as a lead frame for electronic parts or on a terminal of electronic parts and then the surface of the tin-silver alloy plating film is subjected to a heat treatment.

Temperature of the heat treatment is preferably 70–210° C., more preferably 110–170° C., most preferably 135–150° C. By this heat treatment, the crystal phase of the tin-silver alloy plating film changes from the two phases of Sn phase and $Ag_4Sn$ phase to the three phases of Sn phase, $Ag_4Sn$ phase and Ag phase, and an oxide layer is hardly formed on the surface and thus solder wettability is improved.

In the case when an oxide layer is formed by the heat treatment, the oxide layer is preferably is subjected to etching treatment.

Furthermore, according to the method of the present invention, the surface of the tin-silver alloy plating film is subjected to a cleaning treatment with a solution containing a phosphoric acid compound and a carboxylic acid compound.

By carrying out the above cleaning treatment, a phosphorus compound such as P, $PO_2$, or $PO_3$ is present in the vicinity of the surface of the tin-silver alloy plating and this compound inhibits formation of an oxide layer on the surface. Here, "a phosphorus compound is present in the vicinity of the surface of the plating" means that the phosphorus compound is present on the surface of the plating and in the plating layer within 10 Å from the surface. As preferred phosphoric acid compounds used for the cleaning, mention may be made of phosphoric acid, phosphates such as sodium diphosphate and disodium hydrogenphosphate, phosphorous acid, phosphites such as sodium phosphite and sodium hydrogenphosphite, pyrophosphoric acid and pyrophosphates such as sodium pyrophosphate. As preferred carboxylic acid compounds used for the cleaning, mention may be made pyrrolidine-2-carboxylic acid, hydroxy-L-proline and ethane 1,2-dicarboxylic acid.

Content of silver in the tin-silver alloy plating film is preferably 1–8 wt % for inhibiting the formation of whiskers and maintaining the dissolution stability of Ag.

DESCRIPTION OF THE PREFERRED EMBODIMENTS

Figure 1:
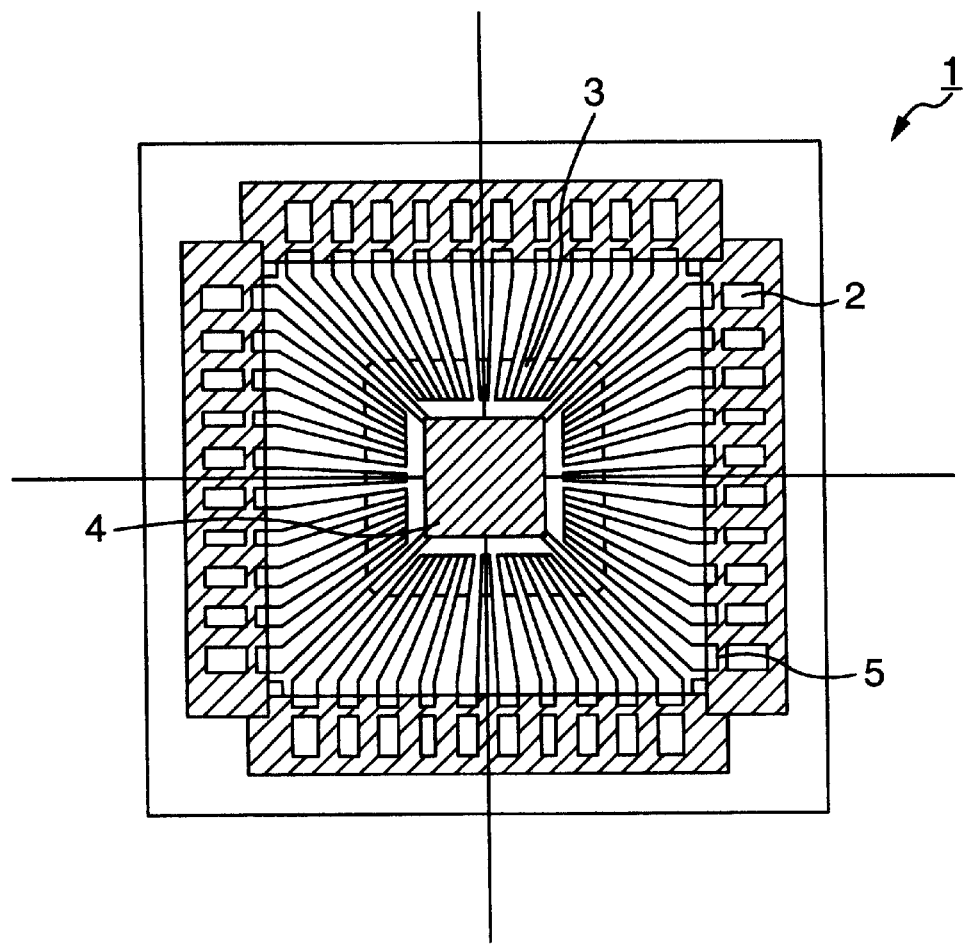
FIG. 1 is a plan view of the lead frame for electronic parts in the preferred embodiment.
Figure 2:
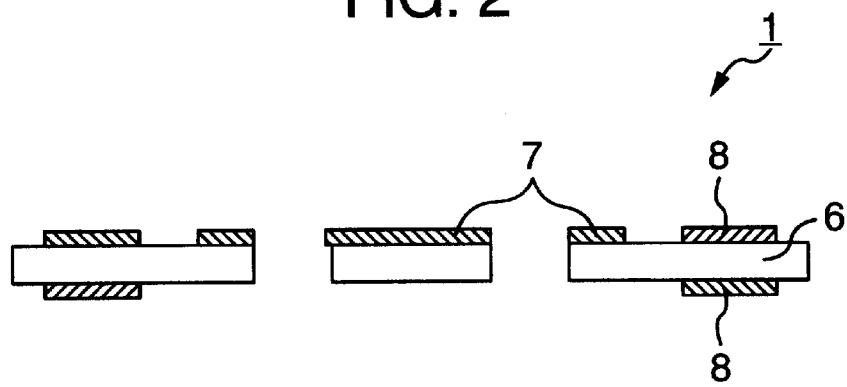
FIG. 2 is a schematic sectional view of the lead frame for electronic parts in the preferred embodiment.
Figure 3:
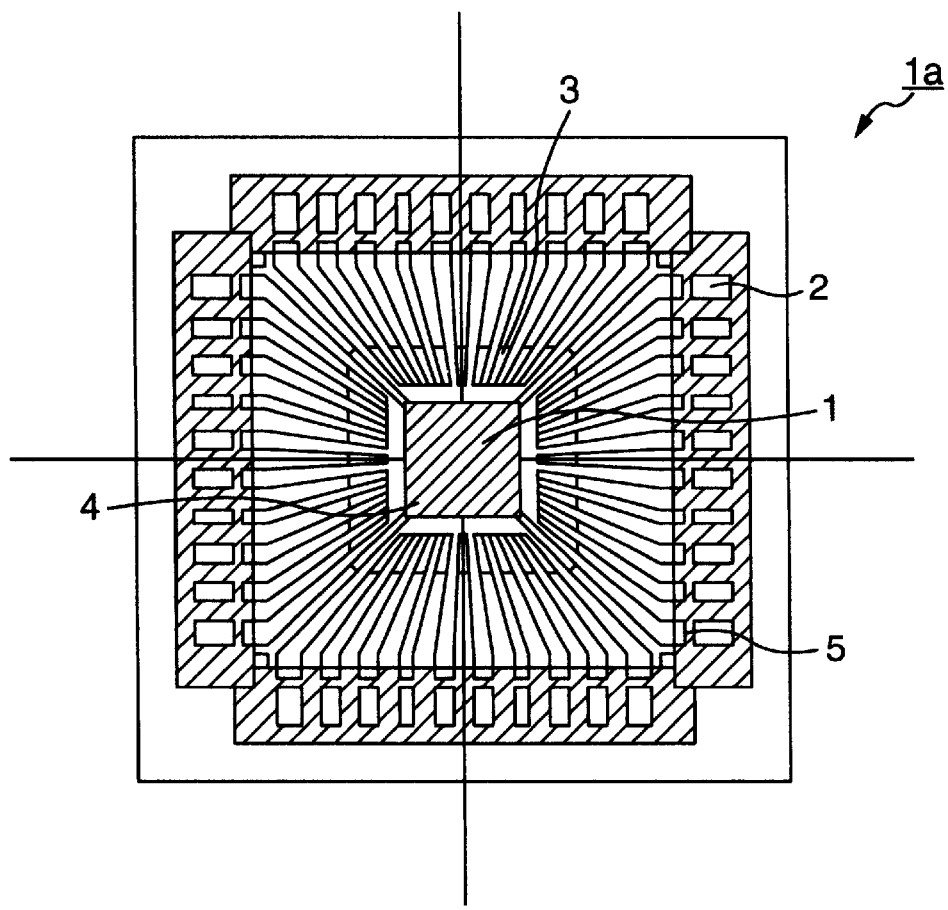
FIG. 3 is a plan view of a general lead frame for electronic parts.
Figure 4:
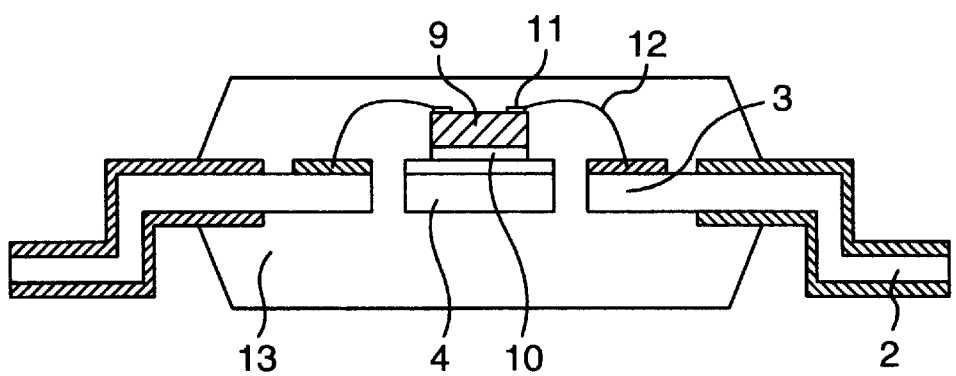
FIG. 4 is a sectional view of the lead frame for electronic parts shown in FIG. 3 on which a semiconductor device has been mounted.

FIG. 1 is a plan view of a lead frame for electronic parts according to the present invention, and FIG. 2 is a schematic sectional view of the lead frame for electronic parts.

In FIG. 1 and FIG. 2, 1 indicates a plate like material of a lead frame for electronic parts, 2 indicates an outer lead portion, 3 indicates an inner lead portion, 4 indicates a pad on which an integrated circuit is mounted, 5 indicates a tie bar portion, 6 indicates a lead frame substrate, 7 indicates an Ag plating film provided on the surface of the inner lead portion 3, and 8 indicates a tin-silver alloy plating film containing silver and tin provided on the surface of the outer lead portion 2.

Here, the lead frame substrate 6 is formed through a step of pressing a thin plate of alloy 194 or the like into the shape of a lead frame and, if necessary, a washing step or a step of correcting the deformation caused when the thin plate is punched out with a press in the pressing step. According to the present invention, since the problem of corrosion does not occur being different from the case of carrying out palladium plating, material of the substrate is not particularly limited and nickel, copper or iron or an alloy containing at least one of nickel, copper and iron can be used. The thin plate may be worked into the shape of a lead frame by an etching step in addition to the pressing step.

Preferred embodiments of the method for producing the tin-silver alloy plating film according to the present invention will be explained referring to the lead frame for electronic parts which is constructed as above. The steps of producing the plating film can be optionally changed, and the present invention is not limited by the following disclosures except for the essential steps.

First, oily matters attaching to the lead frame substrate 6 at the steps of pressing and other steps are removed with an alkali degreasing agent or the like by a dipping method or an electric method or combination of these methods, and a primary plating of preferably 0.2–0.5 μm is formed.

Thereafter, an Ag plating film 7 of preferably 3–8 μm is formed on the inner lead portion 3 by plating with silver.

Then, the surface of the outer lead portion 2 is subjected to etching treatment with at least one treating agent selected from hydrochloric acid, nitric acid and sulfuric acid in order to improve adhesion between the outer lead portion 2 and the tin-silver alloy plating film 8 containing silver and tin which is formed later on the surface of the outer lead portion 2. Thus, the adhesion between the outer lead portion 2 and the tin-silver alloy plating film 8 containing silver and tin can be improved by an anchoring effect.

After the above treatment, a tin-silver alloy plating film 8 is formed on the outer lead portion 2 by electroplating. As to the composition of plating solution, preferably it comprises 50–200 g/L of an acid, 20–60 g/L of tin metal and 0.5–3 g/L of silver metal. The acid can be optionally selected from, for example, alkanesulfonic acids, alkanolsulfonic acids and sulfamic acids. The tin salts can be optionally selected from, for example, tin methanesulfonate and SnO, and the silver salts can be optionally selected from, for example, silver methanesulfonate and $Ag_2O$.

If the tin-silver alloy plating is carried out using a plating bath in which the plating solution contains no additives, occasionally there are formed spongy or resinous precipitates in the resulting plating film and covering power is sometimes conspicuously deteriorated. Therefore, it is preferred that various additives are added to the plating solution to control formation of the plating film, inhibit whitening, improve covering power of the plating, broaden the range of current density used and obtain stable plating bath.

As the additives, there may be used at least as stabilizers for silver one or more of sulfur compounds, thioamide compounds, thiol compounds, and thiosulfates. As stabilizers for tin, there may be used one or more of carboxylic acids, sulfamic acids, pyrophosphates, and chelating agents. As crystal regulators, there may be used one or more of aromatic sulfonates, aliphatic sulfonates, hydantoin compounds, cystein compounds, aromatic organic amines, aliphatic aldehydes, aromatic aldehydes, nonionic surface active agents, amphoteric surface active agents, and anionic surface active agents. The amount of the additives can be optionally set.

The plating method is not limited, and, for example, a jet plating using a sparger can be carried out. Flow rate of the plating solution, temperature of the plating solution, and current density are also not particularly limited and can be optionally set. Positive electrodes can be optionally selected from insoluble electrodes containing preferably at least one of platinum, iridium, tantalum, rhodium, ruthenium and oxides thereof since if soluble electrodes comprising solder alloys are used, the electrodes must be frequently exchanged and the production lines must be stopped each time to cause deterioration of mass productivity.

Thickness of the plating is preferably 3–15 $\mu$m. If the thickness of plating is less than 3 $\mu$m, reduction of solder wettability may occur owing to the influence of the primary coat. If the thickness is more than 15 $\mu$m, troubles such as leakage of the molding resin from the gap of mold may occur at the step of sealing with molding resin. Content of silver in the tin-silver alloy plating film is preferably 1–8 wt %. If the content of silver is less than 1 wt %, whiskers of tin are formed, and if it is more than 8 wt %, dissolution stability of Ag in the tin-silver alloy plating solution lowers and Ag is apt to be precipitated.

After the surface of the outer lead portion 2 is subjected to tin-silver alloy plating, the surface is cleaned to remove the plating solution attaching to the surface. Then, the lead frame 1 for electronic parts is subjected to a heat treatment, for example, in a hot-air oven. Temperature of the hot air (heat treating temperature) can be optionally set in the range of 70–210° C. If the temperature is lower than 70° C., the effect obtained by the heating is low, and if the temperature is higher than 210° C., the tin-silver alloy plating film 8 is sometimes molten. The heat treating temperature is a temperature around the surface of the lead frame to be heat treated. Heating time can be such as enough to allow the tin-silver alloy plating film to reach the heat treating temperature set. The heating time can be determined considering the heating apparatus, heat capacity of the materials and the like.

Subsequently, oxide layer or the like formed on the outermost surface of the tin-silver alloy plating film 8 is subjected to etching. Furthermore, if necessary, silver which leaks onto the side faces of the lead frame 1 for electronic parts is electrically removed to clean the side faces, followed by drying.

After the etching treatment, there may be added a step of cleaning the surface of the tin-silver alloy plating film with a solution containing a phosphoric acid compound and a carboxylic acid compound. As the phosphoric acid compounds, mention may be made of phosphoric acid and phosphates such as sodium diphosphate and disodium hydrogenphosphate; phosphorous acid and phosphites such as sodium phosphite and sodium hydrogenphosphite; and pyrophosphoric acid and pyrophosphates such as sodium pyrophosphate. As the carboxylic acid compounds, there may be used pyrrolidine-2-carboxylic acid, hydroxy-L-proline and ethane 1,2-dicarboxylic acid. Concentrations of the phosphoric acid compound and the carboxylic acid compounds can be set optionally. This cleaning step may be carried out without carrying out the heat treating step.

EXAMPLES

The present invention will be explained below by using examples.

Example 1

From the lead frame for electronic parts using alloy 194 mentioned above, the oily matters attaching at the pressing step was removed. Then, a copper primary plating of 0.2 $\mu$m was formed using a copper cyanide bath at a bath temperature of 40° C. and a current density of 5 A/dm$^2$. Then, a silver plating of 5 $\mu$m was formed on the inner lead portion using a silver cyanide bath at a bath temperature of 60° C. and a current density of 50 A/dm$^2$. Then, the lead frame was dipped in a treating agent containing 10 g/L of hydrochloric acid at 30° C. for 15 seconds, thereby removing impurities which attached to the surface of the outer lead portion and simultaneously etching the surface. Subsequently, a tin-silver alloy plating film was formed on the outer lead portion using a plating solution containing tin methanesulfonate, silver methanesulfonate and methanesulfonic acid as basic components. To the bath were added 2-aminothiophenol and bisphenol A dipolyethylene glycol ether as additives. The plating method was jet plating using a sparger, and the flow rate of the plating solution was 400 L/min, the temperature of the plating solution was 25° C., and the current density was 40 A/dm$^2$. Thickness of the resulting tin-silver alloy plating film was 8 am, and silver content in the film was 3 wt %.

Then, the lead frame on which the tin-silver alloy plating film was formed was heat treated using a hot-air oven at a heat treating temperature of 150° C. for 40 seconds (Example 1). This heat treating temperature (150° C.) was a temperature around the surface of the lead frame 1 for electronic parts which was heat treated.

Subsequently, the oxide layer formed on the outermost surface of the tin-silver alloy plating film was subjected to etching by dipping in an aqueous sodium triphosphate dodecahydrate solution of 120 g/L in concentration at a solution temperature of 60° C. for 30 seconds. Silver which leaked to the side faces was electrically removed, followed by washing and drying.

Examples 2–8

Examples 2–8 were carried out in the same manner as in Example 1 with changing only the heat treating temperature as shown in the following Table 1.

Comparative Example 1

A lead frame 1 for electronic parts was produced in the same manner as in Example 1, except that after the formation of the tin-silver alloy plating film 8 by plating, the heat treatment of the surface and the treatment of etching the oxide layer on the surface with the treating solution containing sodium triphosphate were not carried out.

Comparative Example 2

A lead frame 1 for electronic parts was produced in the same manner as in Example 1, except that after the formation of the tin-silver alloy plating film 8 by plating, the heat treatment of the surface was not carried out.

Comparative Example 3

A lead frame 1 for electronic parts was produced in the same manner as in Example 1, except that the heat treating temperature at the heat treatment was 60° C.

The solder wettability of the tin-silver alloy plating film 8 of the lead frames 1 for electronic parts of the examples and the comparative examples produced as above was measured. The measuring method was as follows.

First, the outer lead portion 2 of the lead frame 1 for electronic parts on which the surface treatment layer was formed was cut and set in a solder wettability testing apparatus, and zero-cross times after exposing it to heat at 175° C. for 12 hours and after exposing it to heat at 85° C. and a humidity of 85% for 16 hours were measured by solder wettability testing process of equilibrium method specified in JIS C 0053. The solder wettability testing apparatus was SWET 100 manufactured by TARUTIN, and the measuring conditions were as follows: soldering bath temperature: 230° C.; falling speed: 10 mm/sec; rising speed: 4 mm/sec; and dipping time: 0.2 sec. The solder used was tin-lead eutectic solder, and the flux used was an isopropanol solution containing 25% of rosin.

The results of the measurement are shown in Table 1. For example, it is shown that in Example 1, when the heat treatment of the lead frame 1 for electronic parts was carried out at a temperature around the surface of 150° C. for 40 seconds, the zero-cross time after exposing it to heat at 175° C. for 12 hours was 1.2 second and the zero-cross time after exposing it to heat at 85° C. and a humidity of 85% for 16 hours was 1.0 second, and no change of color occurred in both the cases. The shorter zero-cross time means the better solder wettability.

lead frame 1 for electronic parts produced in Example 1. The analyzing method was explained below.

The outer lead portion 2 of the lead frame 1 for electronic parts on which the tin-silver alloy plating film 8 was formed was subjected to X-ray diffractometry using an X-ray diffractometer (XRD/RIGAKU RINT-2500 system) with a scanning range of 20–120°, a measuring time of 2 seconds per 1 step, and a step width of 0.02°. As a result, it was found that the tin-silver alloy plating film 8 of the lead frame 1 for electronic parts of Example 1 comprised three phases of Sn phase, $Ag_4Sn$ phase and Ag phase.

As mentioned above, according to the present invention, by carrying out the heat treatment at a heat treating temperature of 70–210° C., preferably 110–170° C., more preferably 135–150° C., oxides are hardly formed on the surface of the tin-silver alloy plating film 8 due to the thermal hysteresis. As a result, heat resistance, color fastness and solder wettability of the tin-silver alloy plating film 8 can be further improved, and solderability of the lead frame 1 for electronic parts can be improved. Moreover, by specifying the silver content in the tin-silver alloy plating film 8 to 1–8 wt %, production of whiskers of tin on the surface of the outer lead portion 2 can be inhibited, and, thus, troubles of short-circuiting of the semiconductor devices due to the production of whiskers of tin can be inhibited. Furthermore, since the crystal phase of the tin-silver alloy plating film 8 comprises three phases of Sn phase, $Ag_4Sn$ phase and Ag phase, heat resistance, color fastness and solder wettability are improved.

TABLE 1

| | Heating temperature (° C.) | Heating time (S) | Zero-cross time after exposing to heat of 175° C. for 12 hours (S) | Change of color after exposing to heat of 175° C. for 12 hours | Zero-cross time after exposing to heat of 85° C. and 85% RH for 16 hours (S) | Change of color after exposing to heat of 85° C. and 85% RH for 16 hours |
|---|---|---|---|---|---|---|
| Example 2 | 70 | 40 | 1.4 | No | 1.8 | No |
| Example 3 | 95 | 40 | 1.2 | No | 1.4 | No |
| Example 4 | 110 | 40 | 1.2 | No | 1.3 | No |
| Example 5 | 135 | 40 | 1.1 | No | 1.1 | No |
| Example 1 | 150 | 40 | 1.2 | No | 1.0 | No |
| Example 6 | 170 | 40 | 1.1 | No | 1.2 | No |
| Example 7 | 190 | 40 | 1.2 | No | 1.5 | No |
| Example 8 | 210 | 40 | 1.2 | No | 1.9 | No |
| Comparative Example 1 | — | — | Longer than 5 | Occurred | Longer than 5 | Occurred |
| Comparative Example 2 | — | — | 2.9 | Occurred | 3.9 | Occurred |
| Comparative | 60 | 40 | 2.6 | Occurred | 3.3 | Occurred |

It is considered that the solder wettability is sufficient when the zero-cross time is not more than 2.0 seconds. Therefore, as can be seen from Table 1, the lead frames 1 for electronic parts in Examples 1–8 were good in solder wettability, and the effect of the heat treatment was conspicuously developed when the heat treating temperature was 110–170° C., particularly 135–150° C. In addition, color fastness was also good, and no change of color occurred after the heating. On the other hand, the lead frames of Comparative Examples 1–3 were inferior in solder wettability and color fastness. That is, it can be seen that lead frames 1 for electronic parts improved in solder wettability and heat resistance can be obtained by heat treating the surface of the tin-silver alloy plating film 8 at 70–210° C. after the formation of the film.

Furthermore, analysis was conducted on the composition of crystal phase of the tin-silver alloy plating film 8 of the In the above examples, the tin-silver alloy plating film 8 was formed by electroplating, but the method is not limited to the electroplating and the film can be formed by physical vapor deposition, sputtering, CVD and other methods. Moreover, in the above examples, a lead frame substrate 6 comprising an alloy of a copper material was used, but the substrate is not limited thereto and the same effects can be obtained by using for example a lead frame substrate 6 comprising 42 alloy.

In addition, in the above examples, explanation was made of tin-silver alloy plating on the lead frame 1 for electronic parts, but the present invention is not limited to this use and can be utilized for printed circuit boards, chip parts and others.

Example 9

A lead frame 1 for electronic parts was produced in the same manner as in Example 1, except that after carrying out the treatment with a treating solution containing sodium triphosphate, a step of cleaning the surface of the tin-silver alloy plating film 8 with a solution containing a phosphoric acid compound and a carboxylic acid compound was further added. Specifically, the cleaning treatment was carried out by dipping in an aqueous solution containing sodium hydrogenphosphite in a concentration of 70 g/L, sodium pyrophosphate in a concentration of 30 g/L and pyrrolidine-2-carboxylic acid in a concentration of 40 g/L at 60° C. for 30 seconds.

Solder wettability of the lead frame 1 for electronic parts of this Example 9 was measured by the same method as in Example 1. The results of measurement at the above heat treating temperature are shown in Table 2.

Furthermore, compositional analysis of the crystal phase was conducted by the same method as in Example 1. As a result, it was found that the tin-silver alloy plating film 8 comprised three phases of Sn phase, $Ag_4Sn$ phase and Ag phase.

Moreover, the formed tin-silver alloy plating film 8 was subjected to microanalysis on the substances contained therein. The microanalysis of the tin-silver alloy plating film 8 was conducted by a time-of-flight type secondary ionic mass analysis method using TRIFT manufactured by TOF-SIMS/Physical Electronics Co., Ltd. Measurement was conducted with primary ionic species $Ga^-$, secondary ionic species Positive/Negative. As a result of the analysis, phosphorus compounds P, $PO_2$ and $PO_3$ corresponding to molecular weights 31, 63 and 79 were measured on the tin-silver alloy plating film 8.

Example 10

A lead frame 1 for electronic parts was produced in the same manner as in Example 1, except that after the formation of the tin-silver alloy plating film 8 by plating, the heat treatment of the surface thereof was not carried out.

The solder wettability of the lead frame 1 for electronic parts of Example 10 was measured by the same measuring method as in Example 1. The results are shown in Table 2.

Furthermore, compositional analysis of the crystal phase was conducted by the same method as in Example 1. As a result of the analysis, it was found that the crystal phase of the tin-silver alloy plating film 8 comprised the two phases of Sn phase and $Ag_4Sn$ phase. Thus, it was recognized that a part of $Ag_4Sn$ changed to Ag and Sn.

Example 11

A lead frame 1 for electronic parts was produced in the same manner as in Example 9, except that a solution containing 200 g/L of sodium phosphite and 100 g/L of sodium pyrophosphate was used as the solution containing phosphoric acid compound.

The solder wettability of the lead frame 1 for electronic parts of Example 11 was measured by the same measuring method as in Example 1. The results are shown in Table 2.

Example 12

A lead frame 1 for electronic parts was produced in the same manner as in Example 11, except that after the formation of the tin-silver alloy plating film 8 by plating, the heat treatment of the surf ace thereof was not carried out.

The solder wettability of the lead frame 1 for electronic parts of Example 12 was measured by the same measuring method as in Example 1. The results are shown in Table 2.

TABLE 2

| | Heating temperature (° C.) | Heating time (S) | Zero-cross time after exposing to heat of 175° C. for 12 hours (S) | Change of color after exposing to heat of 175° C. for 12 hours | Zero-cross time after exposing to heat of 85° C. and 85% RH for 16 hours (S) | Change of color after exposing to heat of 85° C. and 85% RH for 16 hours |
|---|---|---|---|---|---|---|
| Example 9 | 150 | 40 | 0.9 | No | 0.8 | No |
| Example 10 | — | — | 1.2 | No | 1.6 | No |
| Example 11 | 150 | 40 | 0.8 | No | 0.8 | No |
| Example 12 | — | — | 1.1 | No | 1.4 | No |

It can be seen from the results of Examples 9–12 that by applying the heat treatment, formation of oxides on the surface of the tin-silver alloy plating film 8 due to the thermal hysteresis becomes difficult, and it becomes more difficult by cleaning the surface of the tin-silver alloy plating film 8 with a solution containing a phosphoric acid compound and a carboxylic acid compound, thereby allowing a phosphorus compound to be present on the surface of the tin-silver alloy plating film 8. As a result, heat resistance, color fastness and solder wettability of the tin-silver alloy plating film 8 can be further improved. Furthermore, since the crystal phase of the tin-silver alloy plating film 8 comprises the three phases of Sn phase, $Ag_4Sn$ phase and Ag phase, color fastness and solder wettability can be similarly improved.

What is claimed is:

1. A method for producing a tin-silver alloy plating film comprising a step of forming a tin-silver alloy plating film on a surface of a lead frame for electronic parts and a step of heat treating the surface of the tin-silver alloy plating film while maintaining said tin-silver alloy plating film in a solid state.

2. A method for producing a tin-silver alloy plating film according to claim 1, wherein the heat treating temperature is 70–210° C.

3. A method for producing a tin-silver alloy plating film according to claim 1, wherein the heat treating step is conducted after the formation of the tin-silver alloy plating and before etching, washing and drying steps.

4. A method for producing a tin-silver alloy plating film comprising a step of forming a tin-silver alloy plating film on a surface of a lead frame for electronic parts and a step of cleaning a surface of the tin-silver alloy plating film with a solution containing a phosphoric acid compound and a carboxylic acid compound.

5. A method for producing a tin-silver alloy plating film comprising a step of forming a tin-silver alloy plating film on a terminal of electronic parts and a step of heat treating a surface of the tin-silver alloy plating film while maintaining said tin-silver alloy plating film in a solid state.

6. A method for producing a tin-silver alloy plating film according to claim 5, wherein the heat treating temperature is 70–210° C.

7. A method for producing a tin-silver alloy plating film according to claim 5, wherein the heat treating step is conducted after the formation of the tin-silver alloy plating and before an etching, washing and drying step.

8. A method for producing a tin-silver alloy plating film comprising a step of forming a tin-silver alloy plating film on a surface of a lead frame for electronic parts, a step of heat treating the surface of the tin-silver alloy plating film, and a step of cleaning a surface of the tin-silver alloy plating film with a solution containing a phosphoric acid compound and a carboxylic acid compound after the heat treating step.

9. A method for producing a tin-silver alloy plating film according to claim 8, wherein the heat treating temperature is 70–210° C.

10. A method for producing a tin-silver alloy plating film according to claim 8 or 9, wherein said step of heat treating the surface of the tin-silver alloy plating film is performed while maintaining said tin-silver alloy plating film in a solid state.

11. A method for producing a tin-silver alloy plating film according to claim 10, wherein the phosphoric acid compound is at least one compound selected from the group consisting of phosphoric acid, phosphates, phosphorous acid, phosphites, pyrophosphoric acid and pyrophosphates.

12. A method for producing a tin-silver alloy plating film according to claim 11, wherein said step of heat treating the surface of the tin-silver alloy plating film is performed while maintaining said tin-silver alloy plating film in a solid state.

13. A method for producing a tin-silver alloy plating film according to claim 8 or 9, wherein the phosphoric acid compound is at least one compound selected from the group consisting of phosphoric acid, phosphates, phosphorous acid, phosphites, pyrophosphoric acid and pyrophosphates.

14. A method for producing a tin-silver alloy plating film according to claim 13, wherein said step of heat treating the surface of the tin-silver alloy plating film is performed while maintaining said tin-silver alloy plating film in a solid state.

15. A method for producing a tin-silver alloy plating film comprising a step of forming a tin-silver alloy plating film on a surface of a lead frame for electronic parts and a step of cleaning a surface of the tin-silver alloy plating film with a solution containing a phosphoric acid compound and a carboxylic acid compound, wherein the phosphoric acid compound is at least one compound selected from the group consisting of phosphoric acid, phosphates, phosphorous acid, phosphites, pyrophosphoric acid and pyrophosphates.

16. A method for producing a tin-silver alloy plating film according to claim 15, wherein said step of heat treating the surface of the tin-silver alloy plating film is performed while maintaining said tin-silver alloy plating film in a solid state.

17. A method for producing a tin-silver alloy plating film comprising a step of forming a tin-silver alloy plating film on a terminal of electronic parts, a step of heat treating a surface of the tin-silver alloy plating film, and a step of cleaning the surface of the tin-silver alloy plating film with a solution containing a phosphoric acid compound and a carboxylic acid compound after the heat treating step.

18. A method for producing a tin-silver alloy plating film according to claim 17, wherein the heat treating temperature is 70–210° C.

19. A method for producing a tin-silver alloy plating film according to claim 17 or 18, wherein said step of heat treating the surface of the tin-silver alloy plating film is performed while maintaining said tin-silver alloy plating film in a solid state.

* * * * *